(12) United States Patent
Haba

(10) Patent No.: US 6,902,953 B2
(45) Date of Patent: Jun. 7, 2005

(54) METHODS OF FORMING SEMICONDUCTOR STACKED DIE DEVICES

(75) Inventor: Belgacem Haba, Cupertino, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/706,897

(22) Filed: Nov. 13, 2003

(65) Prior Publication Data

US 2004/0097010 A1 May 20, 2004

Related U.S. Application Data

(62) Division of application No. 09/679,143, filed on Oct. 3, 2000, now Pat. No. 6,674,161.

(51) Int. Cl.[7] ............................................... H01L 21/44
(52) U.S. Cl. ........................ 438/107; 438/109; 438/118; 438/119
(58) Field of Search ................................ 438/106, 107, 438/108, 109, 118, 119

(56) References Cited

U.S. PATENT DOCUMENTS

| | | | |
|---|---|---|---|
| 4,394,712 A | | 7/1983 | Anthony |
| 5,229,647 A | | 7/1993 | Gnadinger |
| 5,270,261 A | * | 12/1993 | Bertin et al. ................ 438/109 |
| 5,291,061 A | | 3/1994 | Ball |
| 5,397,916 A | | 3/1995 | Normington |
| 5,424,920 A | | 6/1995 | Miyake |
| 5,434,745 A | | 7/1995 | Shokrgozar et al. |
| 5,563,084 A | * | 10/1996 | Ramm et al. ................ 438/109 |
| 5,682,062 A | | 10/1997 | Gaul |
| 5,691,248 A | * | 11/1997 | Cronin et al. ................ 438/109 |
| 5,864,177 A | | 1/1999 | Sundstrom |
| 5,872,025 A | * | 2/1999 | Cronin et al. ................ 438/109 |
| 5,973,396 A | | 10/1999 | Farnworth |
| 6,051,886 A | | 4/2000 | Fogal et al. |
| 6,093,938 A | | 7/2000 | Minemier et al. |
| 6,104,082 A | | 8/2000 | Berlin et al. |
| 6,109,929 A | | 8/2000 | Jasper |
| 6,160,312 A | | 12/2000 | Raad |
| 6,184,060 B1 | * | 2/2001 | Siniaguine ................. 438/106 |
| 6,239,495 B1 | | 5/2001 | Sakui et al. |
| 6,271,587 B1 | | 8/2001 | Patti |
| 6,350,633 B1 | | 2/2002 | Lin |
| 6,355,501 B1 | | 3/2002 | Fung et al. |
| 6,380,615 B1 | | 4/2002 | Park et al. |
| 6,381,141 B2 | | 4/2002 | Corisis et al. |

FOREIGN PATENT DOCUMENTS

EP          0314437          5/1989

* cited by examiner

*Primary Examiner*—Kevin M. Picardat
(74) *Attorney, Agent, or Firm*—Lee & Hayes, PLLC

(57) ABSTRACT

Semiconductor devices and methods of forming semiconductor devices are described. In one embodiment, a method comprises forming at least one conductive structure within a plurality of semiconductor substrates, said act of forming comprising first forming said at least one conductive structure to extend into a respective semiconductor substrate a distance that is less than an elevational thickness of the substrate, and second removing substrate material elevationally adjacent said one conductive structure effective to expose a surface of said one conductive structure, at least portions of one of the conductive structures having oppositely facing, exposed outer surfaces; and stacking individual substrates together such that individual conductive structures on each substrate are in electrical contact with the conductive structures on a next adjacent substrate.

29 Claims, 3 Drawing Sheets

METHODS OF FORMING SEMICONDUCTOR STACKED DIE DEVICES

RELATED APPLICATION

This application is a divisional application of and claims priority to U.S. patent application Ser. No. 09/679,143, filed on Oct. 3, 2000, now U.S. Pat. No. 6,674,161 the disclosure of which is incorporated by reference herein.

TECHNICAL FIELD

This invention relates to generally to method of forming semiconductor devices and, more particularly to method of forming semiconductor stacked die constructions.

BACKGROUND

Semiconductor devices are typically constructed from a silicon or gallium arsenide wafer through a process involving a number of deposition, masking, diffusion, etching, and implanting steps. Usually, many individual devices are constructed on the same wafer. After fabrication, the wafer is typically sawed or otherwise singulated into individual units, where each unit takes the form of an integrated circuit (IC) die.

It has become a practice in the industry to provided integrated circuit devices in the form of so-called "stacked die" arrangements. Stacked die arrangements typically involve two or more IC die that are fixed upon one another, typically through some type of adhesive arrangement. Interconnections can then be made between the individual die to provide an overall device with a desirable density and enhanced functionality.

Examples of stacked die arrangements are described in detail in the following U.S. Patents, to which the reader is referred for additional detail: U.S. Pat. Nos. 5,291,061; 6,051,886; 5,397,916; 5,434,745; 6,093,939; and 5,864,177.

To date, interconnections between the individual die of stacked die arrangements have been made at or near the periphery of each die. U.S. Pat. Nos. 5,291,061, and 5,397,916 provide very good examples of this type of interconnection. As device processing speeds continue to increase, those involved in the design of semiconductor devices are necessarily forced to consider and reconsider traditionally accepted notions of circuit design. One particular area of interest in the industry concerns the design and fabrication of memory devices, and particularly those memory devices that employ stacked die arrangements.

Accordingly, this invention arose out of concerns associated with providing improved systems that employ stacked die arrangements, and methods of forming the same.

SUMMARY

Semiconductor devices and methods of forming semiconductor devices are described. In one embodiment, a method comprises forming at least one conductive structure within a plurality of semiconductor substrates, said act of forming comprising first forming said at least one conductive structure to extend into a respective semiconductor substrate a distance that is less than an elevational thickness of the substrate, and second removing substrate material elevationally adjacent said one conductive structure effective to expose a surface of said one conductive structure, at least portions of one of the conductive structures having oppositely facing, exposed outer surfaces; and stacking individual substrates together such that individual conductive structures on each substrate are in electrical contact with the conductive structures on a next adjacent substrate.

In another embodiment, a method comprises forming at least one conductive structure within each of a plurality of semiconductor substrates, said at least one conductive structure comprising a multi-layered structure formed through successive depositions and etchings and having oppositely-facing surfaces; exposing portions of each oppositely-facing surface on at least one of the substrates; and processing the substrates sufficient to form electrical connections between the substrates, said processing comprising stacking the substrates on one another so that the conductive structures on adjacent substrates are electrically connected.

In another embodiment, a method comprises forming at least one conductive structure within each of a plurality of semiconductor substrates, each conductive structure having oppositely-facing surfaces; after said forming, exposing portions of at least one oppositely-facing surface on at least one of the substrates, said exposing comprising etching portions of said at least one substrate to expose said at least one surface; and processing the substrates sufficient to form electrical connections between the substrates by stacking the substrates on one another so that electrical connection can be made between conductive structures on adjacent substrates, said processing comprising: forming additional conductive material over and in electrical contact with said exposed portions; and bonding at least some of the additional conductive material on one substrate with additional conductive material on another of the substrates.

In a further embodiment, a method comprises forming at least one multi-layered, conductive pad structure within each of a plurality of semiconductor substrates, each conductive pad structure having oppositely-facing surfaces; exposing portions of each oppositely-facing surface on at least one of the substrates, at least one oppositely-facing surface being exposed by etching portions of said at least one substrate to expose said at least one surface; and after said exposing, forming additional conductive material over and in electrical contact with said exposed portions by plating more than one additional conductive material over said exposed portions.

In yet another embodiment, a method comprises a step for providing a multi-layered structure within a plurality of substrates, the multi-layered structures having a front side and a back side; a step for thinning at least one of the substrates after providing the multi-layered structure; a step for exposing portions of the back side of said at least one substrate that was thinned; a step for forming additional conductive material over and in electrical contact with the multi-layered structure of the substrate that was thinned; and a step for stacking the substrates such that the multi-layered structures with the substrates are in electrical contact with one another.

DETAILED DESCRIPTION

Exemplary Embodiment

Figure 1:
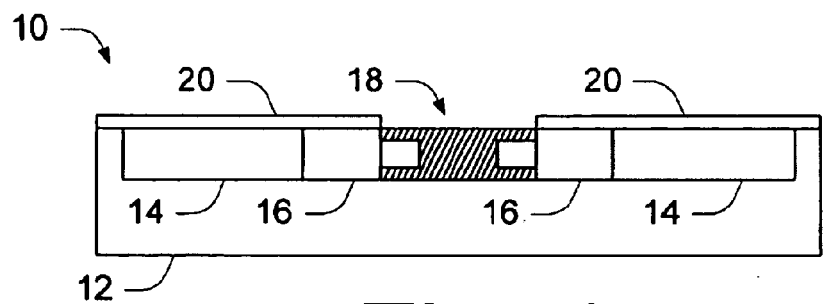
FIG. 1 is a diagrammatic side sectional view of a semiconductor wafer fragment, in process, in accordance with the described embodiment.

FIG. 1 shows a semiconductor wafer, in process, generally at 10 and includes a semiconductor substrate 12. In the context of this document, the term "semiconductor substrate" is defined to mean any construction comprising semiconductive material, including, but not limited to, bulk semiconductive materials such as a semiconductive wafer (either alone or in assemblies comprising other materials thereon) and semiconductive material layers (either alone or in assemblies comprising other materials). The term "substrate" refers to any supporting structure including, but not limited, to the semiconductive substrates described above.

Substrate 12 includes regions 14 that are fabricated to contain or comprise integrated circuit (IC) devices. In a preferred implementation, the integrated circuit devices comprise memory devices. One type of exemplary memory device is a dynamic random access memory (DRAM) device, such as DRAM devices designed by the assignee of this document. It is to be understood, however, that this constitutes but one exemplary type of integrated circuit device that can be provided. Other types of integrated circuit devices (and not necessarily memory devices) can be provided without departing from the spirit and scope of the claimed subject matter.

A pair of regions 16 are shown and comprise interface regions that are designed to provide an interface between the integrated circuit devices within regions 14 and other circuitry that is external of the substrate 12.

A conductive structure 18 is formed within and supported by substrate 12. The exemplary structure 18 can comprise any suitable type of conductive structure and is positioned to make electrical contact with regions 16, and other conductive structures that will ultimately electrically connect the integrated circuit devices to the outside world, as will become apparent below. In a preferred implementation, conductive structure 18 comprises a multi-layered pad structure that is fabricated during processing of the devices in regions 14. The pad structure preferably comprises aluminum and can be formed through successive deposition/etching (or removal) steps.

The conductive structure can be formed at any suitable location within the substrate. It is desirable, however, to have the conductive structure formed at a substrate location that is not at the periphery of the substrate. This is because the conductive structure is going to be used to form electrical connections with other similar conductive structures on other substrates. These substrates will be mounted together in a stacked arrangement so that adjacent substrates are electrically connected through the conductive structures. The manner in which these electrical connections is to be made desirably eliminates the need to make such electrical connections between the substrates at the periphery of, and external to the substrates, as will become apparent below. In the illustrated example, the conductive structure is disposed within the center of the substrate.

An insulative layer 20 is formed over substrate 12 and patterned to expose a front side 18a of conductive structure 18 as shown.

Figure 2:
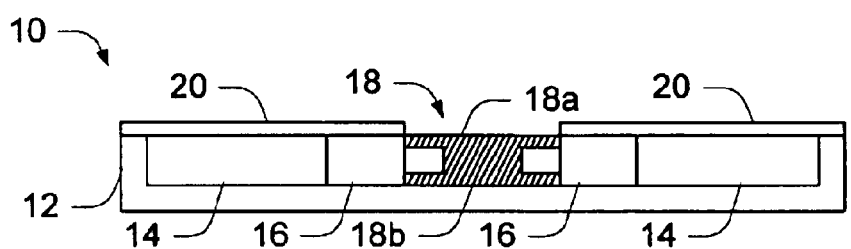
FIG. 2 is diagrammatic side sectional view of the FIG. 1 wafer fragment, in process, in accordance with the described embodiment.

Referring to FIG. 2, wafer 10 is processed to remove a portion of the back side of the wafer, thus thinning the wafer. The wafer can be thinned through the use of any suitable techniques. For example, the wafer can be mechanically (or chemically-mechanical) abraded or polished to achieve the desired thinned wafer.

Figure 3:
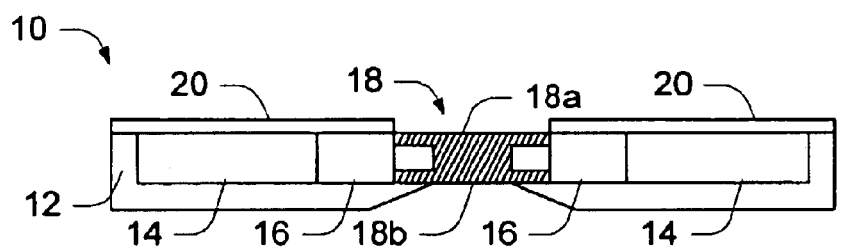
FIG. 3 is a diagrammatic side sectional view of the FIG. 2 wafer fragment, in process, in accordance with the described embodiment.

Referring to FIG. 3, portions of the wafer are removed, as by any suitable processing technique, sufficient to expose at least a portion of backside 18b of conductive structure 18. In the illustrated example, material of the wafer can be selectively etched, relative to the material from which the conductive structure 18 is formed, so that the back side 18b of the conductive structure is exposed. Thus, at this point in the processing of wafer 12, conductive structure 18 has portions of both of its oppositely-facing surfaces exposed.

Figure 4:
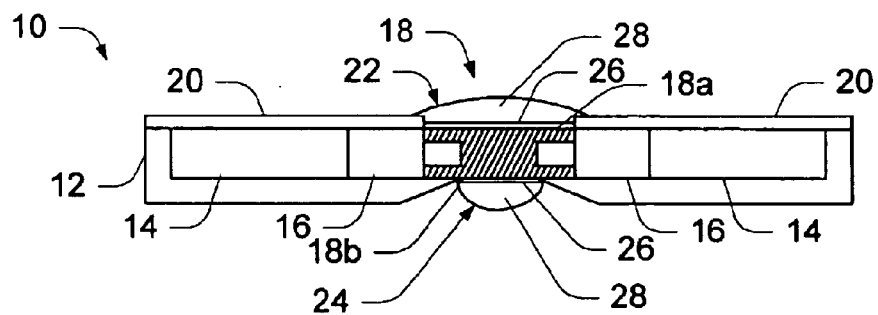
FIG. 4 is a diagrammatic side sectional view of the FIG. 3 wafer fragment, in process, in accordance with the described embodiment.

Referring to FIG. 4, additional conductive material 22, 24 is formed respectively, over and in electrical contact with the oppositely-facing surfaces (i.e. front side 18a and back side 18b) of conductive structure 18. In the illustrated and described embodiment, the conductive material is formed through known plating techniques. In this specific example, more than one conductive material is plated over the conductive structure 18. Specifically, a first conductive material 26, such as nickel, is first formed over the exposed surfaces of the conductive structure 18. Any suitable plating technique, e.g. electroless plating, can be used. After the first conductive material 26 is plated over the exposed surfaces of the conductive structure 18, a second conductive material 28 is formed over and in electrical contact with first conductive material 26. Any suitable techniques can be used such as sputtering, evaporating, or plating to name a few. In the illustrated and described embodiment, second conductive material 28 comprises gold. The second conductive material can, however, comprise any suitable conductive material. For example, an alloy of tin and gold can be used. For purposes of further discussion, conductive material 22 will be referred to as the "top most" conductive material, and conductive material 24 will be referred to as the bottommost" conductive material.

Notice that bottommost conductive material 24 is received entirely within an opening that is defined by a via that exposes the surface of the backside 18b of conductive structure 18. The reason for this will become apparent below.

It should be understood that while only one exemplary substrate is shown as being processed as described, in the preferred embodiment, multiple substrates are typically processed at one time so that they can be eventually joined or bonded together in a die stack.

Figure 5:
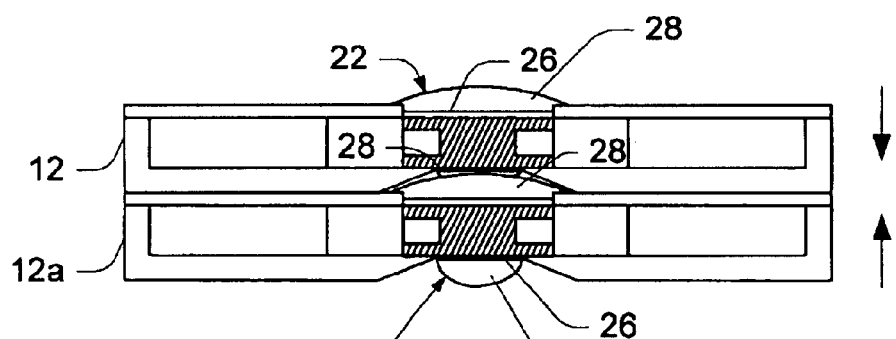
FIG. 5 is a diagrammatic side sectional view of two exemplary substrates mounted in a stacked die arrangement in accordance with the described embodiment.

Referring to FIG. 5, two exemplary substrates 12, 12a are shown. It will be appreciated that substrate 12a can be identical to or different from substrate 12. Substrates 12 and 12a are first moved into engagement with one another and then processed sufficiently such that a conductive bond forms between the bottommost conductive material of substrate 12 and the top most conductive material of substrate 12a. In one exemplary implementation, the conductive bond can be formed by stacking the substrates, either in wafer form or singulated die form, and then joining the conductive material on each of the substrates through ultrasonic thermal compression. This is a good technique to use when the top- and bottommost conductive materials comprise gold. Other techniques can, of course, be used, e.g. thermal compression.

The FIG. 5 construction can thus comprise a first die 12 having IC devices thereon and a second die 12a also having IC devices thereon. Die 12, 12a are mounted together in a stacked arrangement such that the conductive structures of each die are in electrical contact with one another. Thus, the necessity for any such electrical contact to be made external of the substrates or die can be eliminated.

Figure 6:
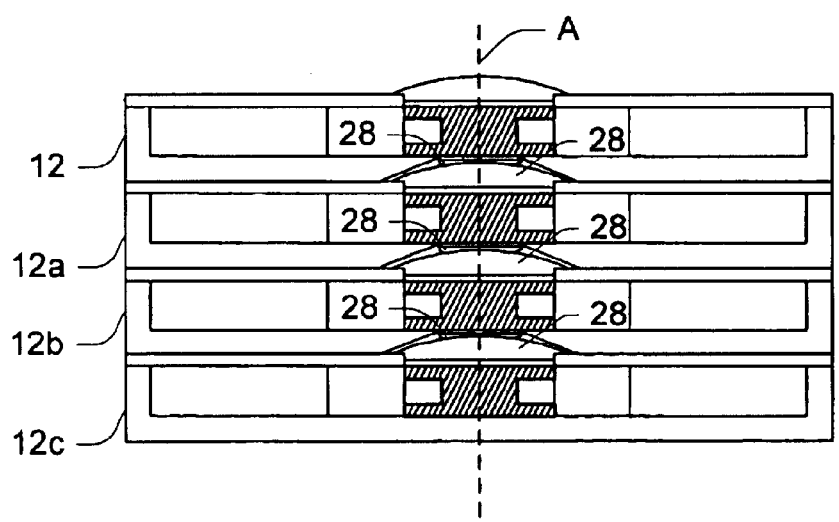
FIG. 6 is a diagrammatic side sectional view of four exemplary substrates mounted in a stacked die arrangement in accordance with the described embodiment.

The above technique can be used to form any suitable number of individual dies into a stacked die arrangement. For example, FIG. 6 shows an arrangement of multiple stacked die that consists of four separate substrates (12–12c) that are joined together as described above. Notice that substrate 12c does not have both faces of its conductive structure 18 exposed.

Hence, the inventive techniques described above enable multiple substrates or die to be formed into a stacked arrangement, with operative electrical connections between the die being made by virtue of conductive structures that are disposed entirely within internal regions of the die. In one preferred embodiment, the conductive structures are formed so that they are generally disposed in the center of each die. It is to be appreciated, however, that the conductive structures can be formed at any suitable location on or within the individual die. In the illustrated and described embodiment, the collection of conductive structures for each die are disposed along a common line A.

Figure 7:
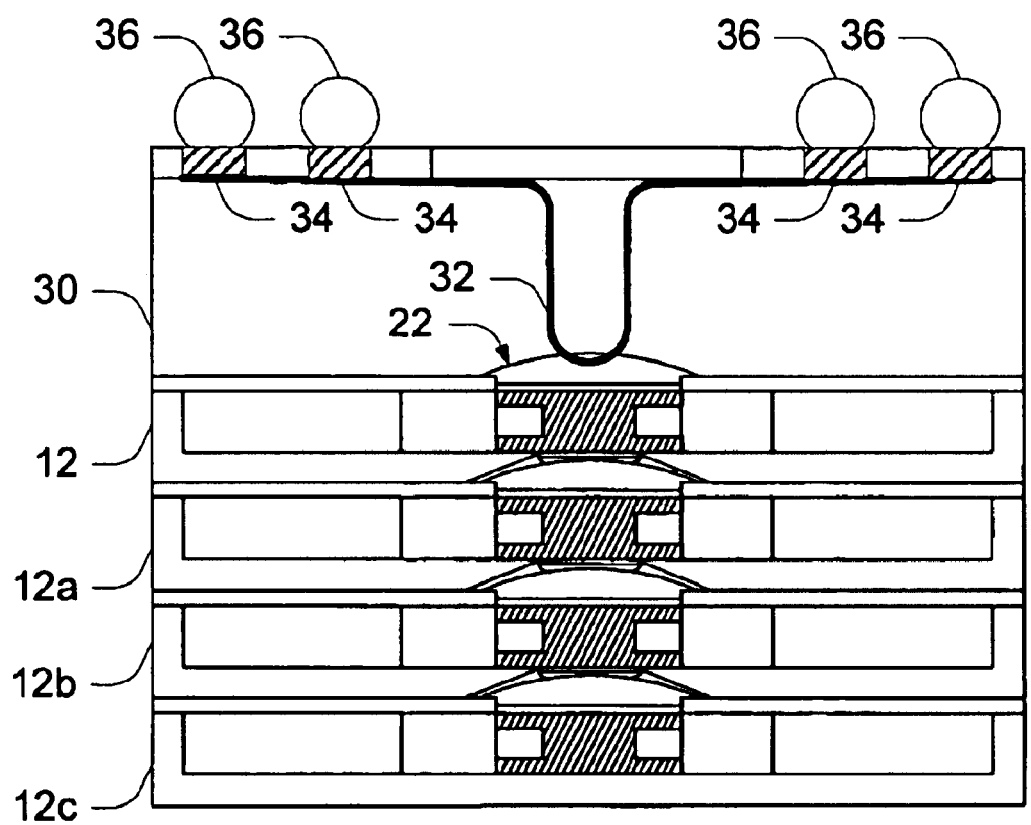
FIG. 7 is a diagrammatic side sectional view of the FIG. 6 wafer fragment, in process, in accordance with the described embodiment.

Once the die have been formed into a stacked arrangement as described above, they can further processed into individual packages. For example, FIG. 7 shows the FIG. 6 die stack where an insulative layer 30 has been formed over the die stack. A conductive line 32 is provided and makes contact with conductive material 22 of the uppermost die 12. Multiple conductive pads 34 are provided over layer 30, with exemplary solder balls 36 being received over each of the pads 34. Processing the die stack can now continue using conventional techniques to form an IC package, as will be appreciated and understood by those of skill in the art.

The various stacked die arrangements that can be formed through the inventive techniques described above are advantageous in that the connective distances as between the individual die can be drastically reduced over other constructions where connections are typically made at the periphery of the die. This is particularly advantageous in the field of memory devices, e.g. SDRAMs and the like, where, for performance purposes, it is highly desirable to reduce stub lengths to the shortest possible distances. In addition, the inventive techniques can enable increased package capacity while providing constructions that more easily dissipate heat. These constructions can more easily dissipate heat because the conductive material joining the individual die can act as a funneling mechanism for heat. Additionally, other material layers, e.g. non-conductive joining material 19 can be formed on the die surfaces to provide not only mechanical support, but further assist in heat dissipation. In addition, the constructions that are provided by the inventive techniques can reduce the number of I/O connections per die. Other advantages will be apparent to those of skill in the art.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A method of forming a semiconductor device comprising:

forming at least one conductive structure within a plurality of semiconductor substrates, said act of forming comprising first forming said at least one conductive structure to extend into a respective semiconductor substrate a distance that is less than an elevational thickness of the substrate, and second removing substrate material elevationally adjacent said one conductive structure effective to expose a surface of said one conductive structure, at least portions of one of the conductive structures having oppositely facing, exposed outer surfaces, both exposed outer surfaces being disposed elevationally inwardly of substrate surfaces that define the elevational thickness; and stacking individual substrates together such that individual conductive structures on each substrate are in electrical contact with the conductive structures on a next adjacent substrate.

2. The method of claim 1, wherein said stacking of the substrates comprises stacking singulated semiconductor die.

3. The method of claim 1, wherein said at least one conductive structure comprises aluminum.

4. The method of claim 1, wherein said at least one conductive structure comprises multi-layered pad structures.

5. The method of claim 1, wherein said at least one conductive structure is not disposed at the periphery of the substrates.

6. The method of claim 1, wherein said stacking of the substrates comprises stacking singulated die, and wherein said at least one conductive structure is disposed within the center of the die.

7. The method of claim 1, wherein the substrates support memory devices.

8. The method of claim 1, wherein the substrates support DRAM devices.

9. A method of forming a semiconductor device comprising:

forming at least one conductive structure within each of a plurality of semiconductor substrates, each substrate having an elevational thickness between two outwardly-facing substrate surfaces, said at least one conductive structure comprising a multi-layered structure formed through successive depositions and etchings and having oppositely-facing surfaces, both oppositely-facing surfaces being disposed elevationally inwardly of said two outwardly-facing substrate surfaces;

exposing portions of each oppositely-facing surface on at least one of the substrates; and processing the substrates sufficient to form electrical connections between the substrates, said processing comprising stacking the substrates on one another so that the conductive structures on adjacent substrates are electrically connected.

10. The method of claim 9, wherein said exposing comprises removing portions of said at least one substrate to expose at least one of the oppositely-facing surfaces.

11. The method of claim 9, wherein said exposing comprises etching portions of said at least one substrate to expose at least one of the oppositely-facing surfaces.

12. The method of claim 9, wherein said exposing comprises selectively etching portions of said at least one substrate relative to material from which the conductive structure is formed to expose at least one of the oppositely-facing surfaces.

13. The method of claim 9, wherein said processing comprises forming additional conductive material over and in electrical contact with said exposed portions.

14. The method of claim 13, wherein said forming of the additional conductive material comprises plating conductive material over and in electrical contact with said exposed portions.

15. The method of claim 13, wherein said forming of the additional conductive material comprises plating more than one conductive material over and in electrical contact with said exposed portions.

16. The method of claim 13, wherein said conductive structures comprise aluminum, and said forming of the additional conductive material comprises plating material comprising nickel over and in electrical contact with said exposed portions.

17. The method of claim 16, wherein said forming of the additional conductive material comprises plating at least one other conductive material over the material comprising nickel.

18. The method of claim 16, wherein said forming of the additional conductive material comprises plating at least one other conductive material comprising gold over the material comprising nickel.

19. A method of forming a semiconductor device comprising;
forming at least one conductive structure within each of a plurality of semiconductor substrates, each semiconductor substrate having an elevatioional thickness between two outwardly-facing substrate surfaces, each conductive structure having oppositely-facing surfaces, both oppositely-facing surfaces being disposed elevationally inwardly of said two outwardly-facing substrate surfaces;
after said forming, exposing portions of at least one oppositely-facing surface on at least one of the substrates, said exposing comprising etching portions of said at least one substrate to expose said at least one surface; and
processing the substrates sufficient to form electrical connections between the substrates by stacking the substrates on one another so that electrical connection can be made between conductive structures on adjacent substrates, said processing comprising:
forming additional conductive material over and in electrical contact with said exposed portions; and
bonding at least some of the additional conductive material on one substrate with additional conductive material on another of the substrates.

20. The method of claim 19, wherein the forming of the additional conductive material comprises plating the additional conductive material over said exposed portions.

21. The method of claim 19, wherein the forming of the additional conductive material comprises plating more than one additional conductive material over said exposed portions.

22. The method of claim 19, wherein said semiconductor substrates support memory devices.

23. The method of claim 19, wherein said semiconductor substrates support DRAM devices.

24. A method of forming a semiconductor device comprising:
forming at least one multi-layered, conductive pad structure within each of a plurality of semiconductor substrates, each semiconductor substrate having an elevational thickness between two outwardly-facing substrate surfaces, each conductive pad structure having oppositely-facing surfaces, both oppositely-facing surfaces being disposed elevationally inwardly of said two outwardly-facing substrate surfaces;
exposing portions of each oppositely-facing surface on at least one of the substrates, at least one oppositely-facing surface being exposed by etching portions of said at least one substrate to expose said at least one surface; and
after said exposing, forming additional conductive material over and in electrical contact with said exposed portions by plating more than one additional conductive material over said exposed portions.

25. The method of claim 24 further comprising after said forming of the additional conductive material, stacking the substrates on one another and bonding at least some of the additional conductive material on one substrate with additional conductive material on another of the substrates.

26. A method comprising:
a step for providing a multi-layered structure within each of a plurality of substrates, each substrate having an elevational thickness between two outwardly-facing substrate surfaces, the multi-layered structures having a front side and a back side, each front side and back side being disposed elevationally inwardly of said two respective outwardly-facing substrate surfaces;
a step for thinning at least one of the substrates after providing the multi-layered structure;
a step for exposing portions of the back side of a multi-layered structure of said at least one substrate that was thinned;
a step for forming additional conductive material over and in electrical contact with the multi-layered structure of the substrate that was thinned; and
a step for stacking the substrates such that the multi-layered structures with the substrates are in electrical contact with one another.

27. The method of claim 26, wherein the step for thinning comprises mechanically abrading said at least one substrate.

28. The method of claim 26, wherein the step for exposing portions of the back side of the multi-layered structure of said at least one substrate comprises selectively etching substrate material relative to material from which the multi-layered structure is formed.

29. The method of claim 26, wherein the step for forming additional conductive material comprises forming a first conductive material over the multi-layered structure and then forming a second different material over the fist conductive material.

* * * * *